(12) United States Patent
Fasching et al.

(10) Patent No.: US 11,360,152 B1
(45) Date of Patent: Jun. 14, 2022

(54) BATTERY CELL END OF LIFE AND DEFECT DETECTION SYSTEM

(71) Applicant: Maxim Integrated Products, Inc., San Jose, CA (US)

(72) Inventors: Rainer Fasching, Mill Valley, CA (US); Georgy Zerkalov, Santa Clara, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 334 days.

(21) Appl. No.: 16/051,418

(22) Filed: Jul. 31, 2018

Related U.S. Application Data

(60) Provisional application No. 62/539,499, filed on Jul. 31, 2017.

(51) Int. Cl.

| | |
|---|---|
| *G01R 31/392* | (2019.01) |
| *G01R 31/367* | (2019.01) |
| *G01R 31/385* | (2019.01) |
| *G01R 31/388* | (2019.01) |
| *G01R 31/389* | (2019.01) |
| *G01R 31/396* | (2019.01) |
| *G01R 31/3842* | (2019.01) |

(52) U.S. Cl.
CPC ......... *G01R 31/392* (2019.01); *G01R 31/367* (2019.01); *G01R 31/386* (2019.01); *G01R 31/388* (2019.01); *G01R 31/389* (2019.01); *G01R 31/3842* (2019.01); *G01R 31/396* (2019.01)

(58) Field of Classification Search
CPC .. G01R 31/392; G01R 31/389; G01R 31/396; G01R 31/386; G01R 31/3842; G01R 31/388; G01R 31/637
See application file for complete search history.

(56) References Cited

U.S. PATENT DOCUMENTS

| | | | | |
|---|---|---|---|---|
| 5,416,403 A | * | 5/1995 | Stephens | G01R 31/389 323/222 |
| 5,620,474 A | * | 4/1997 | Koopman | A61N 1/3708 607/29 |
| 5,633,574 A | * | 5/1997 | Sage | H01M 10/44 320/107 |
| 8,004,243 B2 | | 8/2011 | Paryani et al. | |
| 8,415,926 B2 | | 4/2013 | Bhardwaj et al. | |
| 2002/0075003 A1 | * | 6/2002 | Fridman | H02J 7/0047 324/426 |
| 2008/0204031 A1 | * | 8/2008 | Iwane | G01R 31/389 324/430 |

(Continued)

FOREIGN PATENT DOCUMENTS

| | | | | |
|---|---|---|---|---|
| KR | 20160058281 A | | 11/2014 | |
| WO | WO-2017214276 A1 | * | 12/2017 | ........ H01M 10/0525 |

*Primary Examiner* — Michael J Dalbo
(74) *Attorney, Agent, or Firm* — TIPS Group

(57) ABSTRACT

An integrated circuit device includes a controller, an optional current source coupled to the controller, a voltage sampler coupled to the controller, a current detector coupled to the controller, and memory coupled to the controller, where memory includes code segments executable by the controller to: (a) apply a current pulse to a cell; (b) measure a voltage of the cell during the current pulse; (c) calculate an impedance of the cell from the measured voltage; and (d) determine an operational state of the cell from the impedance.

4 Claims, 11 Drawing Sheets

(56) References Cited

U.S. PATENT DOCUMENTS

| | | | | |
|---|---|---|---|---|
| 2011/0089907 A1* | 4/2011 | Bhardwaj | ................ | H02J 7/00 |
| | | | | 320/136 |
| 2011/0267000 A1* | 11/2011 | Horie | ................ | H02J 7/00308 |
| | | | | 320/107 |
| 2013/0323542 A1* | 12/2013 | Wijayawardhana | .... | H01M 4/13 |
| | | | | 429/50 |
| 2015/0377976 A1* | 12/2015 | Maluf | ................ | G01R 31/392 |
| | | | | 702/63 |
| 2017/0003356 A1* | 1/2017 | Kaib | ................ | G01R 31/389 |
| 2017/0219660 A1* | 8/2017 | Christensen | ............ | B60L 58/16 |
| 2018/0219407 A1* | 8/2018 | Nakamura | ........... | G01R 31/382 |

\* cited by examiner

| Conditions | Impedance pattern | Result | Cause |
|---|---|---|---|
| Replaced cell, New cell | R1 > R0*<br>R0*: expected cell impedance range | Cell might be defective or already used | Poor electric connection, resistive layer on active material, electrolyte leakage |
| Replaced cell, New cell | R3 ≥ R2 ≥ R1 | Cell defect | Poor electric connection, resistive layer on active material, electrolyte leakage |
| Replaced cell, New cell | R3 ≤ R2 ≤ R1 | Cell recovers | Resistive layer rearranged during discharge and becomes conductive |
| Replaced cell, New cell, Cell in use | Rn < 2R0* | Cell OK | |
| Cell in use | Rn > Rn-1 > Rn-2 | Cell enters end of life regime | Resistance layer built up. Decrease of active surface. |
| Cell in use | Rn > 4*R0 | Cell at 80-90% of end of life, replace cell | Significant part of resistive layer built up. Decrease of active surface at the end of cell life. |

Fig. 3

BATTERY CELL END OF LIFE AND DEFECT DETECTION SYSTEM

CROSS REFERENCE TO RELATED APPLICATION

This application claims the benefit of U.S. Ser. No. 62/539,499, filed Jul. 31, 2017, incorporated herein by reference.

BACKGROUND

Electrochemical batteries, each including one or more cells, are used to power many types of electrical and electronic devices. While they come in many shapes, forms and chemistries, the two main categories are primary (non-rechargeable) cells and secondary (rechargeable) cells.

Primary cells have wide application around the world. There are numerous primary cells with different chemistries and operation parameters. For example, there primary cells include zinc-carbon cells, zinc chloride cells, alkaline (zinc-manganese dioxide) cells, oxy nickel hydroxide (zinc-manganese dioxide/oxy nickel hydroxide) cells, lithium (lithium-copper oxide or Li—CuO) cells, lithium (lithium-iron disulfide) LiFeS2 cells, Lithium (lithium-manganese dioxide) LiMnO2 cells, mercury oxide cells, zinc-air cells, silver oxide (silver-zinc) cells, etc.

Primary cells undergo conversion and quasi intercalation reactions during discharge. These reactions are less reversible and build up a reaction material on the active material. Primary cells typically have one anode compartment and one cathode compartment separated by a separation layer. At the same time they have particle size larger than in rechargeable cells (less electron and ion accessibility at discharged state because there is no reversibility required). These two aspects result in a lower surface area architecture but with higher energy density compared to rechargeable cells. Low surface area architecture typically causes higher impedance change if a resistive layer build up occurs.

Since primary cells cannot be charged, it is hard to define reference for fuel gauge for a battery. Furthermore, some primary cells, for instance, with LiSOCl2 chemistry, have flat horizontal voltage discharge curve on a graph, where voltage is plotted versus time. That prevent using the voltage to determine cell's state of charge or 10% to end of life. During long term storage (exposure to heat and self discharge) and discharge a resistive shell on the active material will grow.

With reference to FIG. 1, three examples of resistive layer changes on active material due to discharge reaction are illustrated. In example #1, a resistive layer 10 is formed initially on active material 12 of a cell 14 and becomes more conductive during discharge (porosity or reconfiguration) as seen at 10', thus impedance response decreases. The build up of the passivation layer happens during long term storage or exposure to nonstandard temperatures. During discharge the resistivity decreases and the cell recovers.

In FIG. 1, example #2, the resistive layer 16 around active layer 18 of a cell 20 becomes thicker or denser during discharge due to further growth of the layer as seen at 16', thus impedance response increases. The build up of passivation layer happens during long term storage or exposure to nonstandard temperatures. During discharge the resistivity stays high or increases further signaling a defective cell.

In FIG. 1, example #3, a significant amount of active material 22 of a cell 24 is consumed and a passivation layer 26 becomes thicker, while active surface area diminishes, thus impedance response increases. As the passivation layer 26 builds up during discharge, the nonlinear increase of impedance signals EOL regime of the cell. Loss of electrolyte due to a leakage of the container will cause in an increased resistivity and signal a defective cell as well.

These and other limitations of the prior art will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures:

FIG. 3 is a table including cell conditions, impedance patterns, results and causes for several examples of battery cells;

DETAILED DESCRIPTION OF EXAMPLE EMBODIMENTS

Embodiments, set forth herein by way of example and not limitations, relate to methods and apparatus for detecting end of life and health of batteries through measurements of internal cell impedance. Disclosed embodiments may be used in the electrochemical and electronic industries to analyze the state of health of battery cells and provide warnings of approaching end of life (EOL) and other internal problems of primary and secondary batteries. In certain example embodiments, a pulse impedance method is used to determine state of health and EOL of primary batteries. Advantageously, certain example embodiments consume <0.01% of battery energy in the detection process and do not require a reference model.

Figure 1:
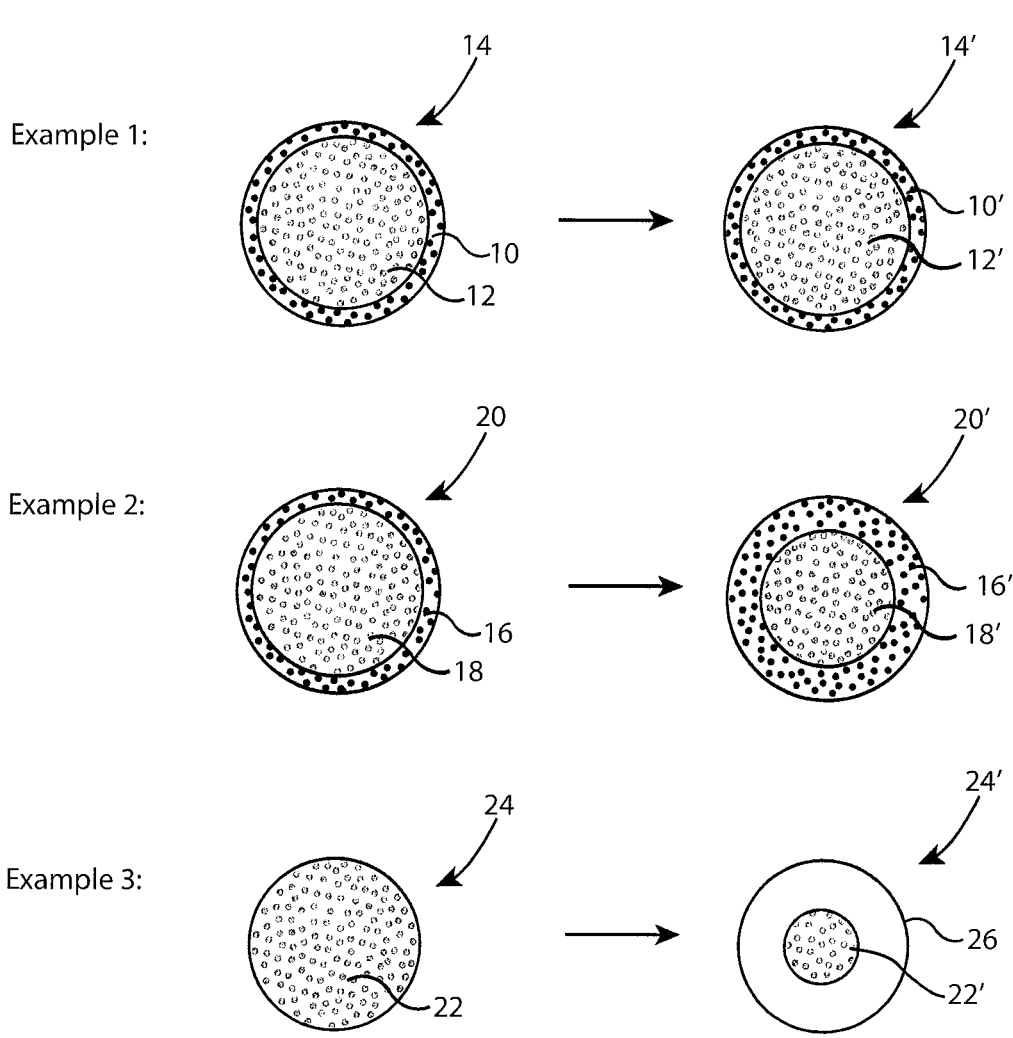
FIG. 1 illustrates three examples of resistive layer change on active material of battery cells due to discharge reactions.
Figure 2:
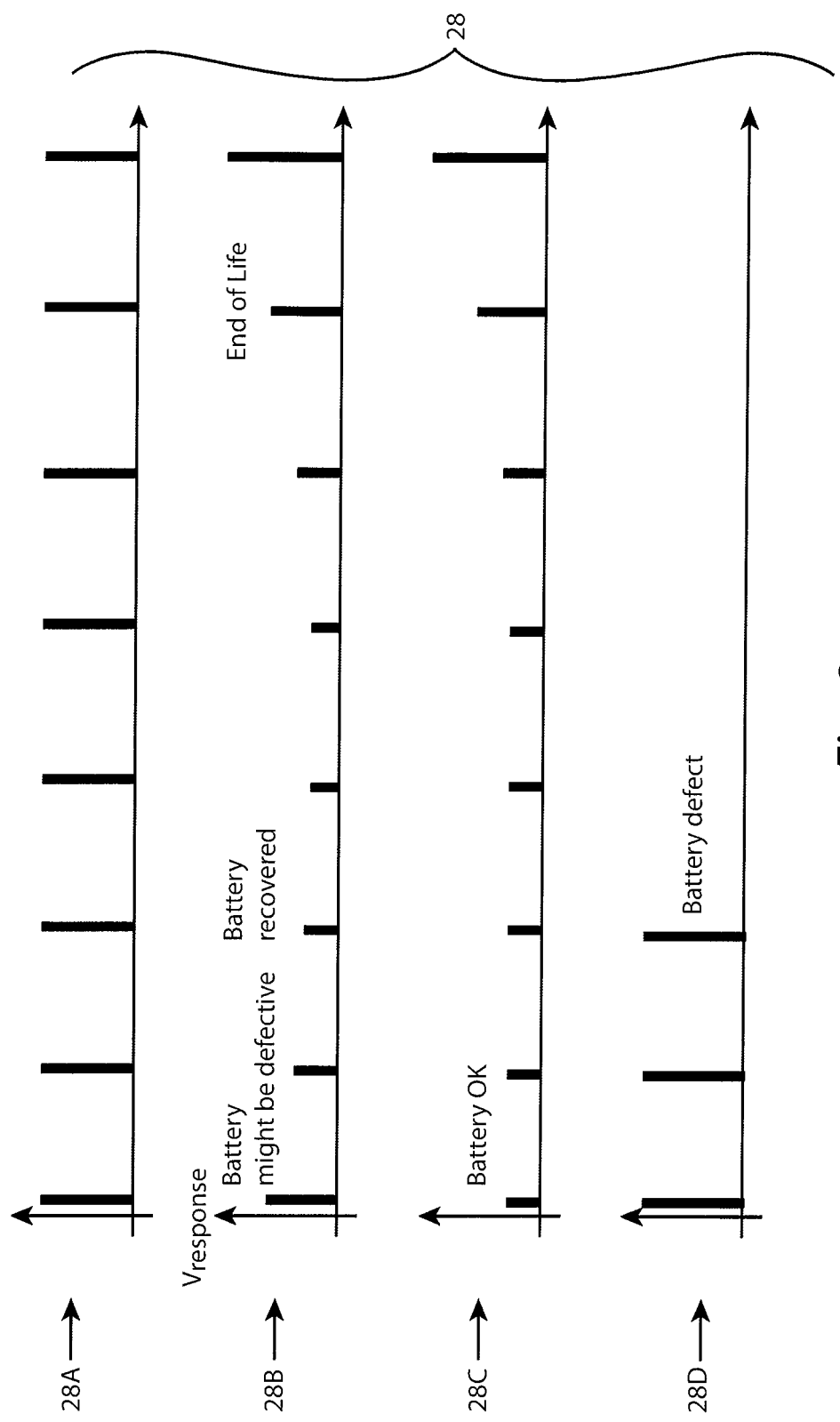
FIG. 2 includes graphs illustrating the application of test pulses during the lifespan of a battery.

In FIG. 2, a series of related graphs 28 illustrate the voltage responses to short discharge pulses that are applied during cell discharge of various cells. Graph 28A illustrates the test pulses. These could be artificial discharge pulses or natural pulses associated with higher loads. The current in test pulses should be higher than the normal load of the cell. Once the pulses are applied, the associated voltage drop (which is directly related to the impedance of the cell) can be assessed to determine the state of health of the cell and its end of life. In the following examples, test pulses of the same current are applied at different states of charge.

In FIG. 2, example #1, as illustrated by graph 28B, the voltage response, and therefore the impedance, is high at the beginning, which might signal that the battery is defective. Later on, the impedance decreases, which corresponds to smaller voltage drops during pulses. That means that the battery has recovered and is beginning to operate normally. Closer to the lower state of charge the impedance again starts growing, which signals that the cell is approaching end of life (EOL).

In FIG. 2, example #2, as illustrated by graph 28C, the initial impedance is low, corresponding to insignificant passivation layer in the cell, which could mean fresher battery than in example #1. The cell's impedance again increases towards the end of its lifetime.

In FIG. 2, example #3, as illustrated by graph 28D, the cell's impedance is very high from the beginning, and doesn't recover over time. This means that the cell is either defective, or has previously been discharged. In either case, this battery cell is not operable.

In FIG. 3, a table 30 includes cell conditions, impedance patterns, results and causes for various cell examples. R0* represents expected cell impedance. R1 represents measured impedance associated with the first pulse, R2 represents impedance associated with the second pulse, etc.

Figure 4:
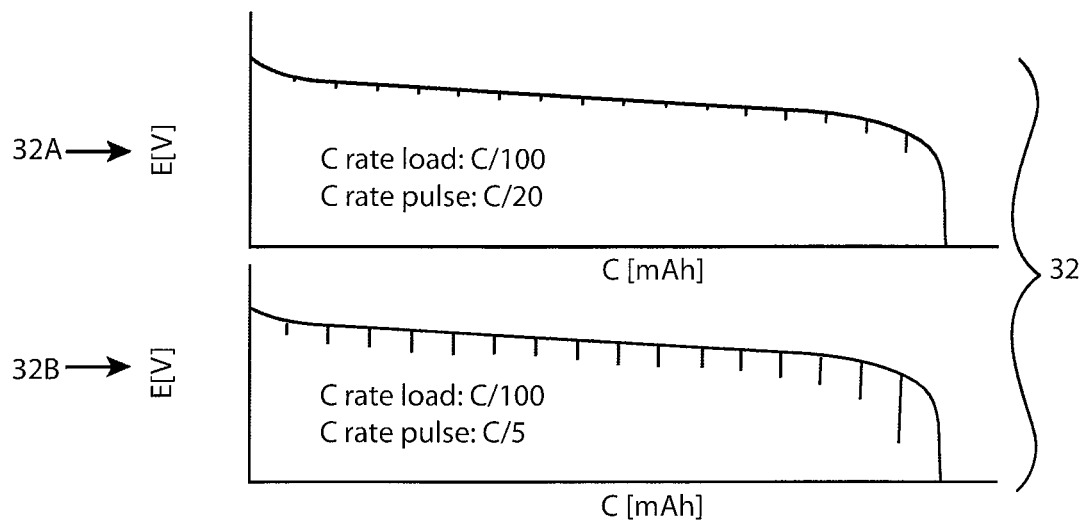
FIG. 4 includes graphs illustrating tests of alkaline cells at C/100 load and different pulse rates.

In FIG. 4, a pair of graphs 32 include a first graph 32A and a second graph 32B which illustrate the running of the tests on the alkaline cells at a C/100 load and different pulse rates. In this non-limiting example, graph 32A illustrates C rate pulse of C/20, and graph 32B illustrate a C rate pulse of C/5. It is noted that, in both cases, the impedance increases as the cell approaches the end of life.

Figure 5:
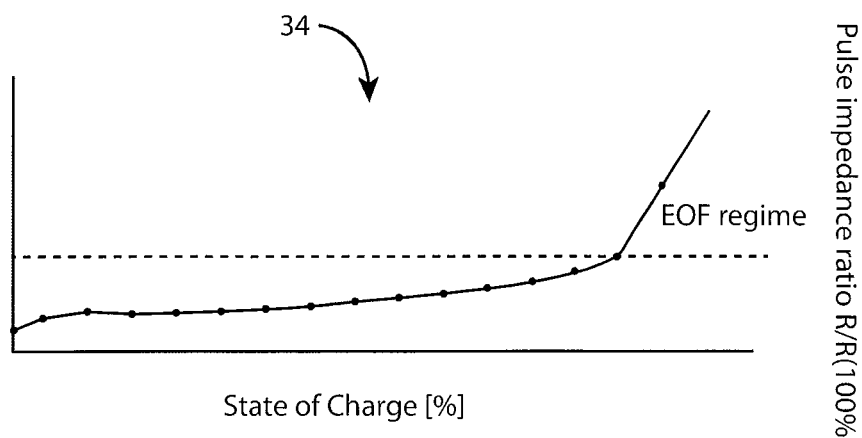
FIG. 5 is a graph plotting State of Charge (SOC) vs. Pulse Impedance Ratio.

In FIG. 5, a graph 34 illustrates voltage drops associated with the pulses. It can be seen that the pulse impedance ratio (R(current)/R (100% SOC)) increases significantly towards the end of life of the cell.

Figure 6:
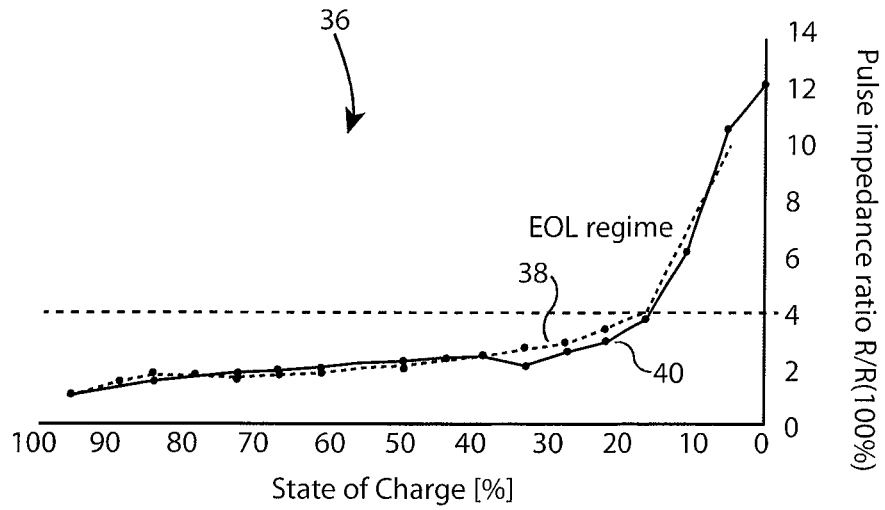
FIG. 6 is a graph plotting State of Charge (SOC) vs. Pulse Impedance Ratio at different temperatures.

As seen in FIG. 6, a graph 36 illustrates that if the temperature is increased, the voltage drop also increases. For example, the curve 38 was plotted at 23° C. and the curve 40 was plotted at 30° C. Nonetheless, the pulse impedance ratio stays approximately the same, independently of the temperature, as can be seen in graph 36.

Is should be noted that it is easier to predict the end of life of alkaline cells, since they have non-flat voltage discharge curves, as opposed to, for example, lithium battery cells. Fuel gauges containing coulomb counter and/or voltage sensing devices can determine the states of charge of alkaline cells, but are ineffective for use with cells with flat curves, such as lithium cells with a $LiSOCl_2$ chemistry.

Figure 7:
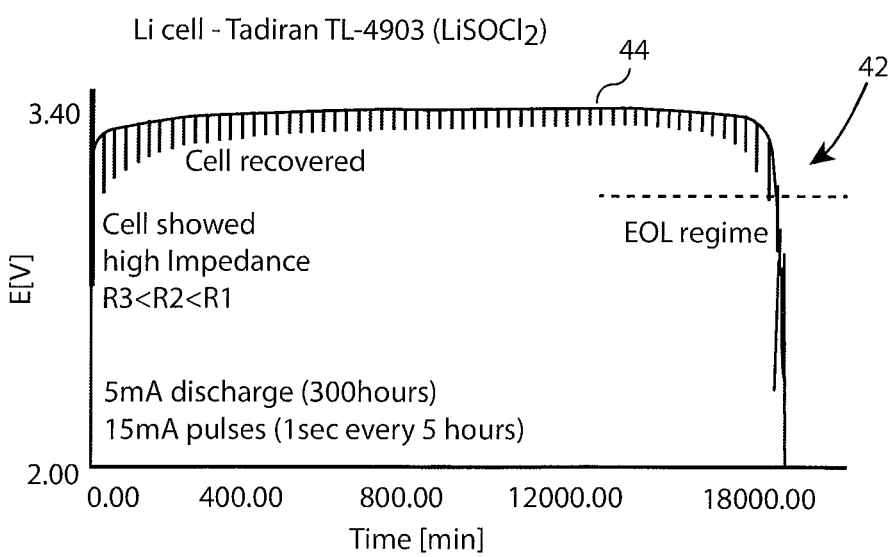
FIG. 7 is a graph illustrating a discharge curve of a lithium cell having $LiSOCl_2$ chemistry.
Figure 8:
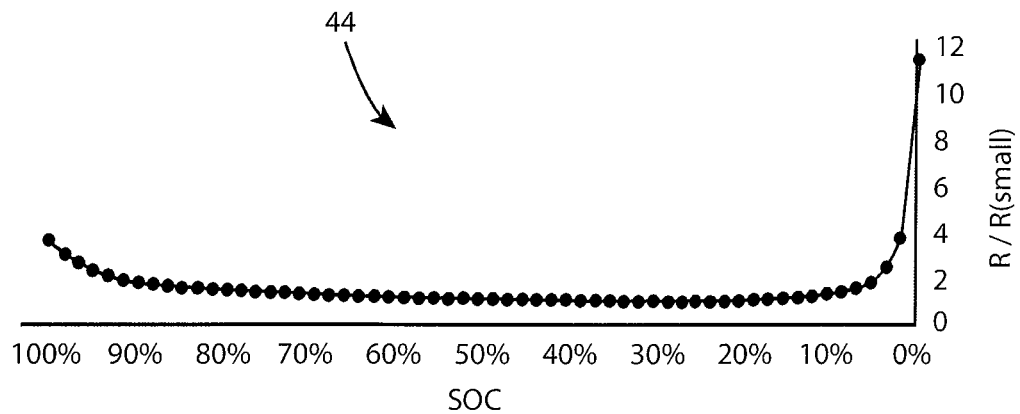
FIG. 8 is a graph plotting State of Charge (SOC) vs. impedance.

In FIG. 7, a graph 42 illustrates a discharge curve 44 of a lithium (Li) cell with $LiSOCl_2$ chemistry with current pulses to determine impedance. As can be seen, the voltage (and therefore the impedance) stays constant for an extended period of time, until it collapses at the end of life (EOL) of the cell. It should be noted, however, that the cell's impedance starts growing well before that, signaling an impending EOL the cell, providing an early EOL warning. FIG. 8 illustrates with a graph 44 that when impedance ratio starts increasing, the cell is approaching EOL.

Figure 9:
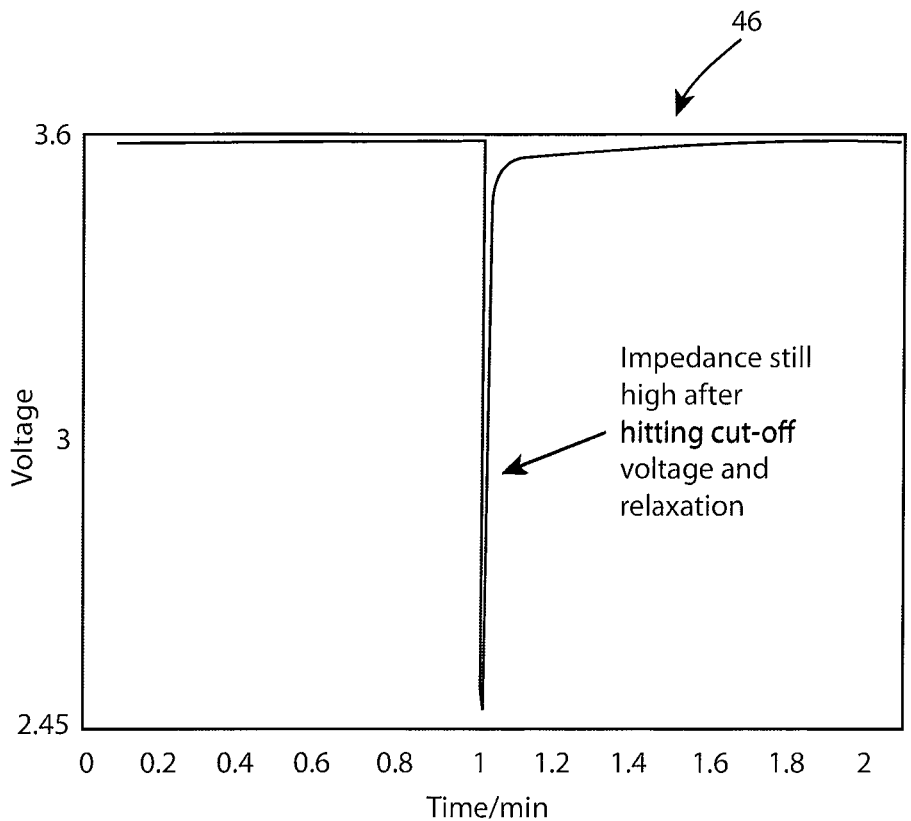
FIG. 9 is a graph illustrating that impedance is still high after hitting cut-off voltage and relaxation.

It should be noted that the lithium cell that used for the example tests described above had been stored on a shelf for about 3 years, implying that a passivation layer may have built up over time. With additional reference to graph 46 of FIG. 9, this is confirmed by observing the decreasing impedance of the cell at the beginning of the discharge cycle. It should also be noted that once the cell is discharged and relaxed for some time, the current pulse confirms that the impedance level is still high.

Figure 10:
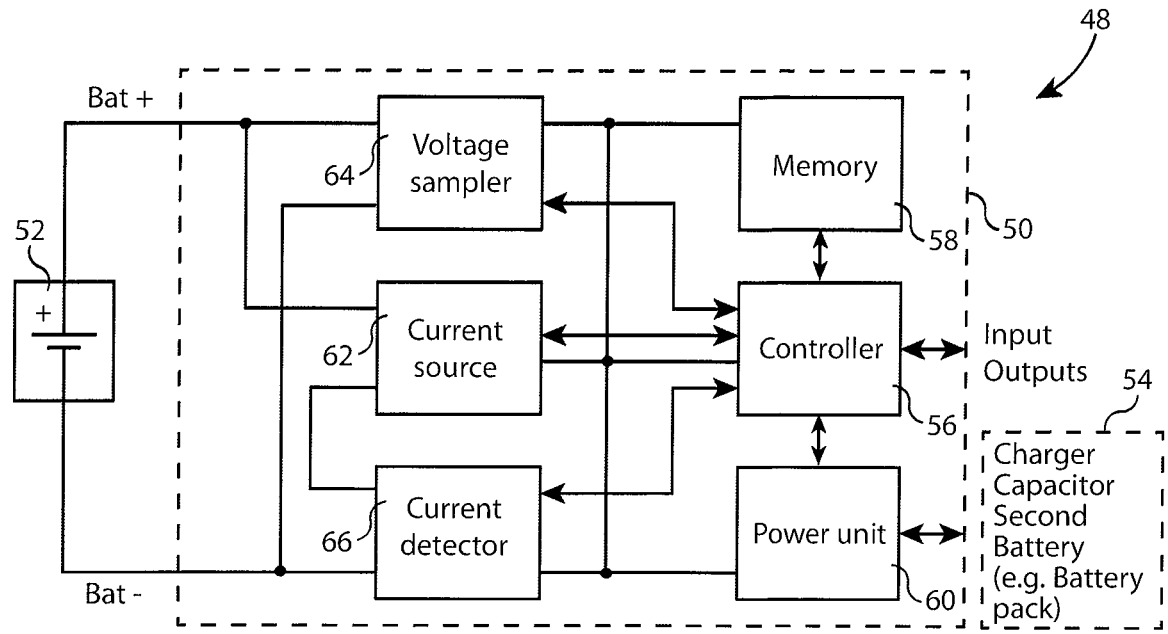
FIG. 10 is a block diagram of an example battery cell end of life detection system.

In FIG. 10, a block diagram of a battery cell end of life (EOL) and defect detection system 48 includes a battery cell analyzer 50, a device under test (DUT) battery cell 52, and a power source 54. The battery cell analyzer 50 is, in a non-limiting example, provided as an integrated circuit (IC). However, the battery cell analyzer 50 may be implemented with discrete components, or combinations of discrete components and/or ICs. Furthermore, the battery cell analyzer 50 can be combined with the power source 54 and/or the battery cell 52, as will be appreciated by those of skill in the art.

Example battery cell analyzer 50 includes a controller 56, a memory 58, a power unit 60, a current source 62, a voltage sampler 64 and a current detector 66. Controller 56 is preferably a digital processor capable of executing program code segments to implement various computer-implemented processes. A positive terminal of cell 52 is coupled to current source 62 and to voltage sampler 64, while a negative terminal of cell 52 is coupled to the current detector 66. The power source 54 can be any suitable power source, including a battery charger, an battery (e.g. a battery pack), a capacitor (which may be charged by the cell 52 or otherwise), etc.

Figure 11:
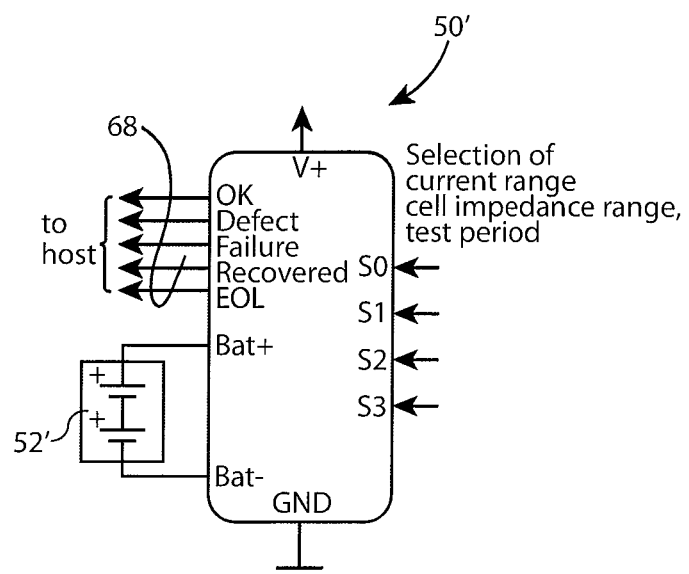
FIG. 11 is an illustration of an integrated circuit including an example battery cell end of life detector.

In FIG. 11, an integrated circuit (IC) 50', set forth by way of example and not limitation, has four control/data input pins {S0, S1, S2, S3}, a BAT+ pin, a BAT− pin, five output pins indicating the condition of the battery (e.g. OK, Defect, Failure, Recovered, EOL), a power input pin V+ and a ground pin GND. A device under test (DUT) battery 52' comprising two cells is coupled to the Bat+ and Bat− pins. The control/data input pins can be used, by way of non-limiting example, to select a current range, a cell impedance range, a test period, etc.

It should be noted that a number of protocols (a/k/a processes and/or methods) can be implemented for testing battery cells based upon the principals described herein. Some of these protocols, set forth by way of example, can be implemented by the battery cell analyzer 50. For example, code segments, executable by controller (e.g. digital processor) 56, can be stored in memory 58 to implement various example protocols. However, it will be appreciated by those of skill in the art that combinations, subsets and extensions of these protocols will also provide useful results in various situations, applications and environments.

Figure 12:
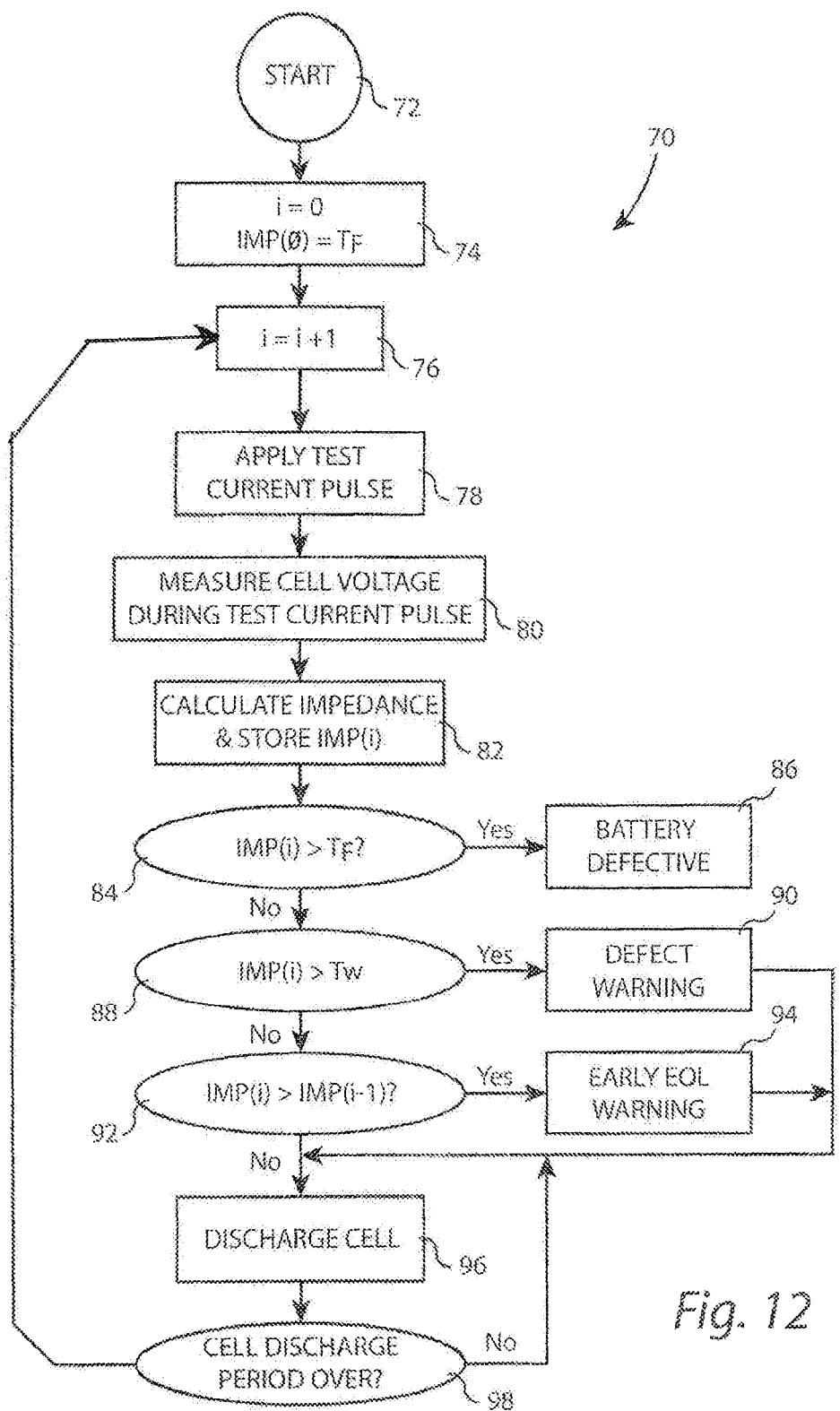
FIG. 12 is flow diagram illustrating an example method for detecting end of life (EOL) and defects of a battery cell.

FIG. 12 is a flow diagram illustrating an, example process (a/k/a method and protocol) 70 for detecting end of life (EOL) and defects in a battery cell. The process 70 begins at 72 and, in a step 74 counter variable "i" is set to zero, and a vector array element IMP(0) is arbitrarily set to a failure threshold $T_F$. Next, in an operation 76, the variable i is incremented. Next, in operations 78 and 80, a test current pulse is applied to the cell and the voltage of the cell is measured during the test current pulse. In an operation 82, the impedance is calculated from the measured voltage and is stored in the vector array element IMP(i). A decision operation 84 determines if IMP(i)>$T_F$ and, if so, an operation 86 determines that the battery cell is defective. If not, then a decision operation 88 determines if IMP(i)>$T_W$<$T_F$ and, if so, an operation 90 warns that there is a possible defect in the cell. If not, a decision operation 92 determines if IMP(i)>IMP(i−1), i.e. if the impedance detected with the current, pulse is greater than the impedance detected with the previous pulse and, if so, provides an early EOL warning in an operation 94. Next, an operation 94 provides for the discharge of the cell, and an operation 98 determines if the cell discharge period is over. If so, process control returns to operation 76 to apply the next test current puke.

In another example protocol, the following operational steps are performed:
1. Initial current pulse applied;
2. Measurement of cell voltage during current load;
3. Calculation of impedance and comparison to expected value;
4. If it higher than a threshold report a warning;
5. Apply a second pulse after a certain discharge time;
6. Assess impedance if impedance lowered or is increasing;
7. Report a cell failure if impedance remains higher than a threshold;
8. If impedance was low or recovered over the initial testing period apply current pluses at certain time of discharge;
9. If impedance increases report a warning; and
10. If impedance increases to an certain threshold report a EOL warning.

Figure 13:
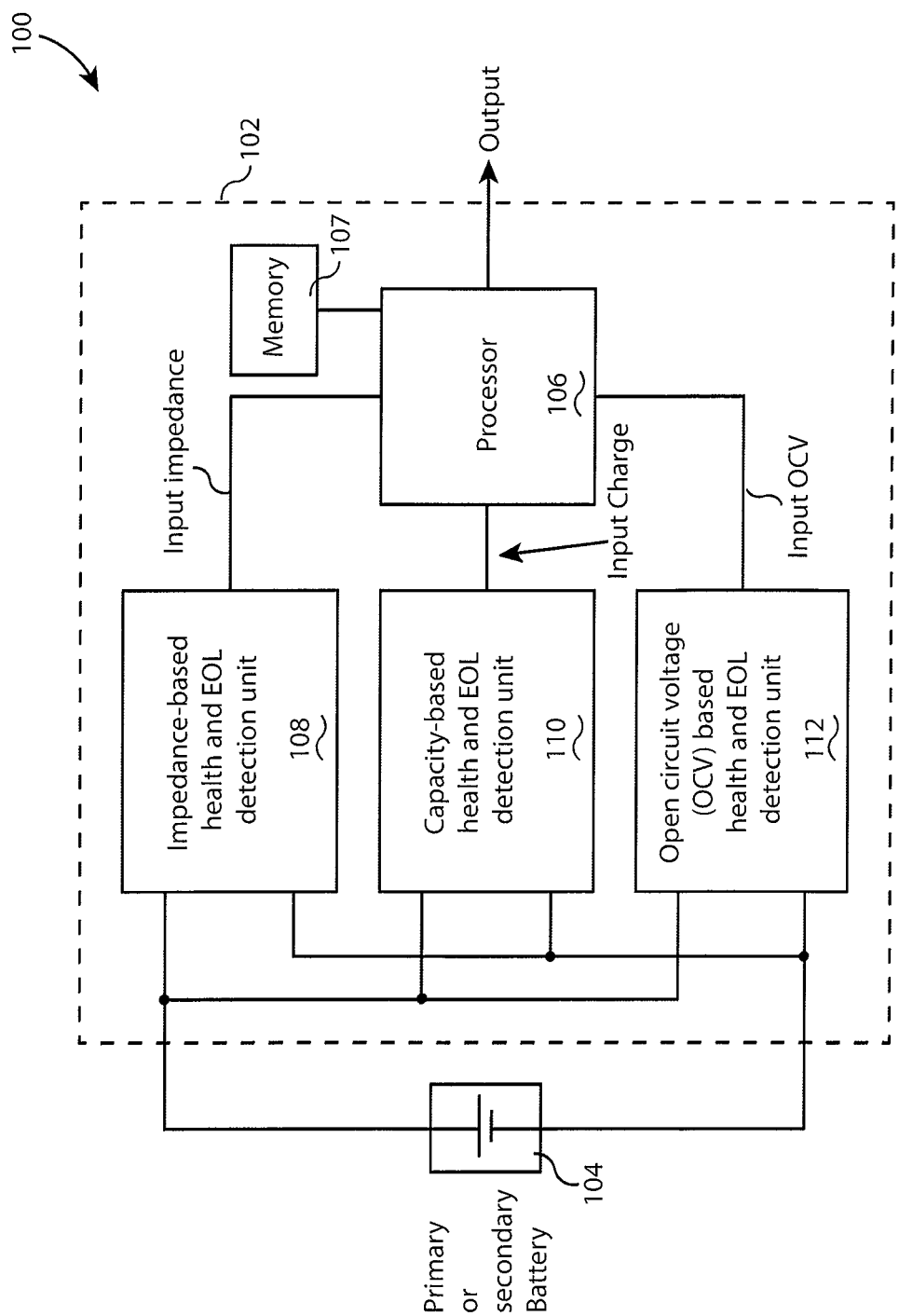
FIG. 13 is a block diagram of an example battery cell end of life and defect detection system.

In FIG. 13, a block diagram of a battery cell end of life (EOL) and defect detection system 100, set forth by way of example and not limitation, includes a battery cell analyzer 102 and a device under test (DUT) battery cell 104. The battery cell analyzer 102 includes a processor 106, a memory 107 coupled to the processor 106, an impedance-based health and EOL detection unit 108, a capacity-based health and EOL detection unit 110, and an open circuit voltage (OCV) based health and EOL detection unit 112. The processor 106 executes code segments stored in computer-readable media, such as memory 107, to process and combine impedance, charge and OCV data from detection units 108, 110, and 112, respectively to output, by way of non-limiting examples, include health and end of life output values and/or matrix, a state of charge (SOC) assessment, a failure mode of the cell, etc.

Example battery cell analyzer 102 is advantageous in that it can be used to determine overall health and end of life of both primary and secondary batteries. By combining the impedance based methodologies described above with charge-based and/or open-circuit based methodologies, the results of two or all three methodologies can be processed and/or combined to provide fast, accurate determinations of the overall health and EOL of the cell.

In this non-limiting example, the output of the battery cell analyzer 102 is as follows:

$$\text{Output}=\text{function}(\text{Input}_{Impedance},\text{Input}_{Charge},\text{Input}_{OCV})$$

For example, the function simply sums the inputs such that Output=$\text{Input}_{Impedance}$+$\text{Input}_{Charge}$+$\text{Input}_{OCV}$. Examples of the use of the Input and Output signals is as follows:
  If Output >Threshold, a warning of an aged battery is made for both primary and secondary cells;
  A function of Output over time is used for EOL prediction of a secondary cell;
  A function over time of Inputs and Output is used for failure mode detection such as Li loss, loss of active material, surface impedance build up, etc.
  A function over time of Inputs and Outputs is used to control charge and discharge modes for mitigation of failure modes.

Figure 14:
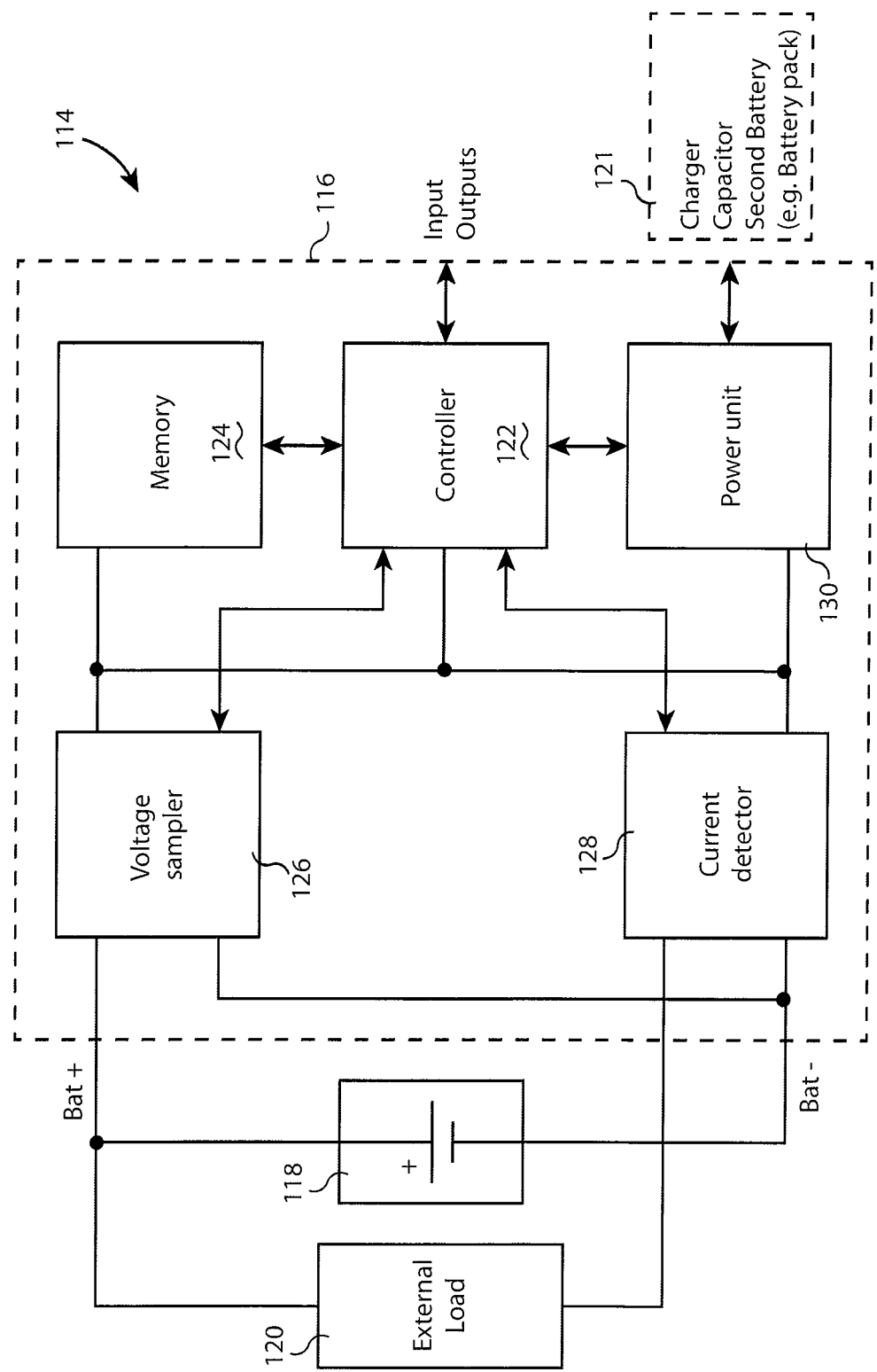
FIG. 14 is a block diagram of an example battery cell and end of life detection system with an external load.

In FIG. 14, a block diagram of an example battery cell end of life and defect detection system 114 includes a battery cell analyzer 116, a device under test (DUT) battery cell 118, an external load 120, and a power source 121. The battery cell analyzer 116 is, in this non-limiting example, provided as an integrated circuit (IC). However, the battery cell analyzer 116 may be implemented with discrete components, or combinations of discrete components and/or ICs. Furthermore, battery cell analyzer 116 can be combined with the battery cell 118, the external load 120, and/or the power source 121, as will be appreciated by those of skill in the art.

Example battery cell analyzer 116 includes a controller ("processor") 122, a memory 124, a voltage sampler 126, a current detector 128, and a power unit 130. Controller 122 is preferably a digital processor capable of executing program code segments to implement various computer-implemented processes. A positive terminal of cell 118 is coupled to voltage sampler 126 and a negative terminal of cell 118 is coupled to voltage sampler 126 and current detector 128. External load 120 is coupled between the positive terminal of cell 118 and the current detector 128. The power source 121 can be any suitable power source, including a battery charger, a battery (e.g. a battery pack), a capacitor (which may be charged by the cell 118 or otherwise), etc.

Figure 15:
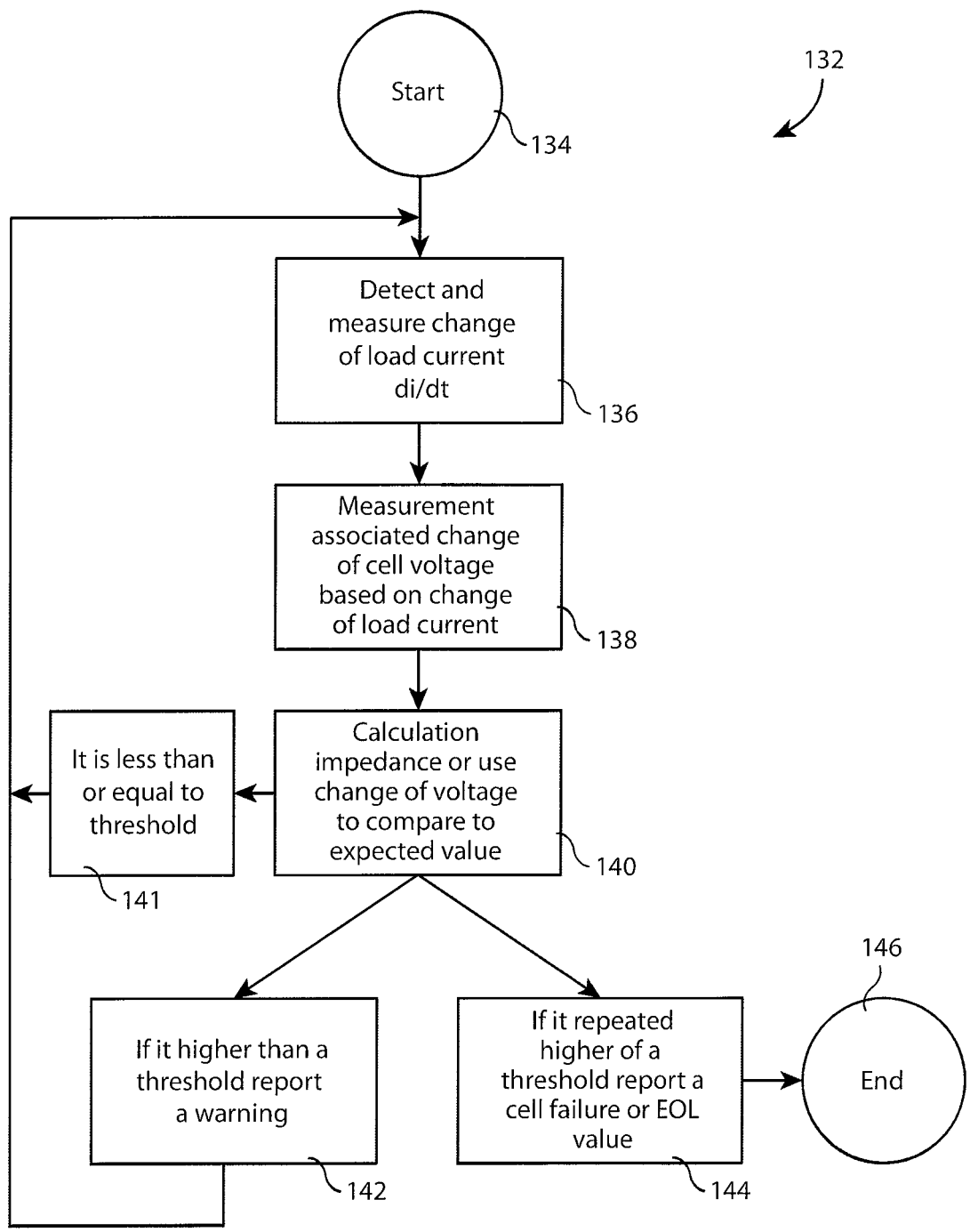
FIG. 15 is a flow diagram illustrating example methods for operating the battery cell and end of life detection system of FIG. 14.

FIG. 15 is a flow diagram illustrating an example process (a/k/a "method" or "protocol") 132 for early warning of end of life (EOL) and defects in a battery cell. The process 132 may be implemented in code segments stored, for example, in memory 124 and executed on controller 112 of battery cell analyzer 116. The process 132 begins at 134 and, in an operation 136, the process detects and measures a change in load current (di/dt). Next, in an operation 138, a measurement and associated change of cell voltage is determined based upon the change in load current. In an operation 140, the impedance is calculated and/or a change in voltage is used to compare to an expected value ("threshold value") with one of three results. If it is less than or equal to a threshold, process control is returned to operation 136. If it is higher than the threshold, but has not been proximately proceeded by one or more other higher values, a warning is made in an operation 142 and process control also returns to operation 136. If it is repeatedly higher than the threshold value, e.g. is higher than the threshold a number of consecutive times, a report of cell failure or and end-of-life (EOL) value is provided in an operation 144 and process 132 ends at 146.

As another example, the process 132 can be used to calculate the resistivity (e.g. resistive impedance) of the cell for an EOL prediction from multiple measurements of cell voltage and current taken over time. It is noted that resistivity of the battery cell tends to increase with an approach of its end of life. The change of resistivity can be obtained by filtering the changing voltage and current measurements of the load, and the EOL can be predicted by an analysis of the change in resistivity over time.

Although various embodiments have been described using specific terms and devices, such description is for illustrative purposes only. The words used are words of description rather than of limitation. It is to be understood that changes and variations may be made by those of ordinary skill in the art without departing from the spirit or the scope of various inventions supported by the written disclosure and the drawings. In addition, it should be understood that aspects of various other embodiments may be interchanged either in whole or in part. It is therefore intended that the claims be interpreted in accordance with the true spirit and scope of the invention without limitation or estoppel.

What is claimed is:

1. A method for testing a battery cell comprising:
   (a) applying a current pulse to a battery cell with a battery cell analyzer, wherein the battery is a device under test (DUT) by the battery cell analyzer and is not connected to an operating load;
   (b) measuring a voltage of the battery cell solely during the current pulse;
   (c) calculating a calculated impedance of the battery cell from the measured voltage and storing the calculated impedance in a non-transitory computer readable media;
   (d) determine that the battery cell is defective to the point of failure if the calculated impedance is greater than a failure threshold and, if so, stopping the testing of the battery cell;
   (e) determine that the battery cell may have a defect to provide a warning if the calculated impedance is less than the failure threshold but greater than a warning threshold;
   (f) determine an indication of end of life (EOL) of the battery cell when an impedance of the battery cell during the current pulse is greater than an impedance of the battery cell during a preceding pulse that was stored in the non-transitory computer readable media;
   (g) discharge the cell with the battery cell analyzer for a cell discharge period; and
   (h) continuously repeat operations (a)-(g) after the cell discharge period until the battery is determined to be defective to the point of failure in operation (d).

2. An integrated circuit device comprising:
   a controller;
   a voltage sampler coupled to the controller;
   a current detector coupled to the controller; and
   memory coupled to the controller, the memory including code segments executable by the controller to:
   (a) apply a current pulse to a battery cell, wherein the battery is a device under test (DUT) and is not connected to an operating load;
   (b) measure a voltage of the battery cell solely during the current pulse;
   (c) calculate a calculated impedance of the battery cell from the measured voltage and storing the calculated impedance in a non-transitory computer readable media;
   (d) determining that the battery cell is defective to the point of failure if the calculated impedance is greater than a failure threshold and, if so, stopping the testing of the battery cell;
   (e) determine that the battery cell may have a defect to provide a warning if the calculated impedance is less than the failure threshold but greater than a warning threshold;
   (f) determining an indication of end of life (EOL) of the battery cell when an impedance of the battery cell during the current pulse is greater than an impedance of the battery cell during a preceding pulse that was stored in the non-transitory computer readable media;
   (g) discharging the cell for a cell discharge period; and
   (h) continuously repeating operations (a)-(g) after the cell discharge period until the battery is determined to be defective in operation (d).

3. An integrated circuit device as recited in claim 2 further comprising a power unit providing power to the controller, the memory, the voltage sampler, and the current detector.

4. An integrated circuit device as recited in claim 3 further comprising a current source coupled to the controller and powered by the power unit.

* * * * *